(12) United States Patent
Kotowski

(10) Patent No.: US 6,532,568 B1
(45) Date of Patent: Mar. 11, 2003

(54) APPARATUS AND METHOD FOR CONDITIONING POLYSILICON CIRCUIT ELEMENTS

(75) Inventor: Thomas W. Kotowski, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 191 days.

(21) Appl. No.: 09/698,410

(22) Filed: Oct. 30, 2000

(51) Int. Cl.[7] .................. H01L 21/336; H01L 29/00; H01C 10/00; H01C 1/012; G03C 5/00; G01C 25/00

(52) U.S. Cl. .................. 716/1; 438/301; 438/382; 438/384; 438/385; 257/536; 257/538; 338/195; 338/308; 430/313; 702/116

(58) Field of Search .................. 716/1–21

(56) References Cited

U.S. PATENT DOCUMENTS

| | | | | |
|---|---|---|---|---|
| 4,455,547 A | * | 6/1984 | Murakami et al. | 257/538 |
| 5,640,137 A | * | 6/1997 | Mantha | 338/195 |
| 5,670,820 A | * | 9/1997 | Campbell et al. | 257/538 |
| 6,054,359 A | * | 4/2000 | Tsui et al. | 438/385 |
| 6,069,063 A | * | 5/2000 | Chang et al. | 438/382 |
| 6,140,910 A | * | 10/2000 | Smith et al. | 338/308 |
| 6,143,474 A | * | 11/2000 | Shen et al. | 430/313 |
| 6,211,031 B1 | * | 4/2001 | Lin et al. | 438/384 |
| 6,263,476 B1 | * | 7/2001 | Browen et al. | 702/116 |
| 6,306,715 B1 | * | 10/2001 | Chan et al. | 438/301 |
| 6,306,718 B1 | * | 10/2001 | Singh et al. | 438/301 |
| 2002/0047183 A1 | * | 4/2002 | Shiiki et al. | 257/538 |
| 2002/0070424 A1 | * | 6/2002 | Uenishi | 257/536 |

\* cited by examiner

Primary Examiner—Matthew Smith
Assistant Examiner—Andrea Liu
(74) Attorney, Agent, or Firm—Jimmy L. Funke

(57) ABSTRACT

An apparatus and method for conditioning polysilicon circuit elements includes a supply source configured to impress a desired voltage or current upon a polysilicon circuit element including at least a polysilicon resistor for a desired signal duration. The desired voltage or current and signal duration are chosen to cause an irreversible decrease in the resistance of the polysilicon circuit element without generating enough heat to re-alloy the resistor contacts or fuse open the resistor. The process of the present invention may be selectively performed on desired ones of a number of polysilicon resistors forming an array or matrix to thereby program the array or matrix with a desired binary code. Alternatively, the process may be used to pre-condition all the resistors in an array or matrix to thereby facilitate subsequent programming thereof via conventional fusing techniques.

11 Claims, 5 Drawing Sheets

APPARATUS AND METHOD FOR CONDITIONING POLYSILICON CIRCUIT ELEMENTS

TECHNICAL FIELD

The present invention relates generally to techniques for altering the resistivity of polysilicon circuit elements, and more specifically such techniques for conditioning polysilicon resistors for use in integrated circuitry.

BACKGROUND OF THE INVENTION

Electronic circuit elements that are capable of at least temporarily changing logic states have heretofore been extensively used as memory elements in electronic circuitry. For example, such elements having two distinct and discernable logic states may be used to store binary information, as is known in the art.

One example of an electronic circuit element that may be used to store binary information is a so-called fusable link, or fuse. Fuses are typically formed in integrated circuitry as sheets or strips of electrically conductive material having as one logic state a conductive path therethrough and as an opposite logic state a fused open condition. Several types of conductive materials have been used for constructing such fuses in the past including, for example, circuit metalization, polysilicon, and the like, wherein a collection of such fuses are typically used to form one or more arrays or matrices of fuses (often referred to as memory blocks) for storing binary data. Such memory blocks may be programmed with binary data by selectively opening certain ones of the fuses while leaving others in their conductive state, as is known in the art.

Fuses of the foregoing type are typically referred to as nonvolatile memory elements in that the operational states thereof (i.e., either normally conductive or fused open) do not change when electrical power is removed from the memory unit. One popular material for forming such fuses is polysilicon. Polysilicon sheets or strips are fabricated in a conventional manner to form polysilicon resistors that fuse open at reasonably low current levels, operate reliably over wide temperature ranges, and are electrically, mechanically and chemically stable.

Although polysilicon resistors of the foregoing type have been successfully used in many integrated circuit applications to form memory elements as described, they have certain drawbacks associated therewith. For example, as with most integrated circuit resistors, polysilicon resistors often exhibit circuit-to-circuit and wafer-to-wafer resistance variations. Outlier resistors may accordingly require programming voltage/current levels that are more or less than expected, and programming such resistors may accordingly be more difficult to accomplish. As another example, the fusing operation may create resistor debris that could eventually result in unwanted circuit behavior at any time. As still another example, fusable resistors typically require removal of the integrated circuit passivation layer in the vicinity of the fusing sites. As a result, the underlying circuitry is susceptible to chemical or mechanical damage.

What is therefore needed is a technique for conditioning polysilicon resistors for use as fuse elements that avoids at least some of the drawbacks of prior art polysilicon fusable resistor techniques. Such a technique may be used to condition polysilicon resistors prior to fusing, or alternatively to replace the fusing technique with an improved programming technique that provides similar functional results while avoiding some of the drawbacks associated with the fusing process.

SUMMARY OF THE INVENTION

The foregoing shortcomings of the prior art are addressed by the present invention. In accordance with one aspect of the present invention, a method of electrically conditioning a polysilicon circuit element comprises the steps of providing a polysilicon circuit element, and injecting a first magnitude of current into the polysilicon circuit element, wherein the first magnitude of current causes an irreversible change in the resistance of the polysilicon circuit element from a first resistance value to a second lower resistance value.

In accordance with another aspect of the present invention, an apparatus for electrically conditioning a polysilicon circuit element comprises a polysilicon circuit element defining a first resistance value, and a current source responsive to a first control signal to supply a first magnitude of current to the polysilicon circuit element, wherein the first magnitude of current causes an irreversible change in the resistance of the polysilicon circuit element from the first resistance value to a second lower resistance value.

In accordance with a further aspect of the present invention, a memory circuit comprises a number of polysilicon circuit elements each defining a first resistance value, a current source producing a first current level, and means for coupling the current source to desired ones of the polysilicon circuit elements to thereby cause the first current level to flow therethrough, wherein the first current level causes irreversible changes in resistances of the desired ones of the polysilicon circuit elements from the first resistance value to a second lower resistance value, the number of polysilicon circuit elements thereby forming a memory circuit having a binary code programmed therein.

One object of the present invention is to provide a technique for electrically conditioning polysilicon circuit elements.

Another object of the present invention is to provide for such a technique electrically by injecting a constant current level into a polysilicon circuit element to thereby cause an irreversible change in the resistance thereof from a first resistance level to a second reduced resistance level.

Still another object of the present invention is to form a binary memory circuit comprised of a number of polysilicon circuit elements wherein some of the number of such elements exhibit the first resistance level and others are electrically conditioned to exhibit the second resistance level.

These and other objects of the present invention will become more apparent from the following description of the preferred embodiments.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
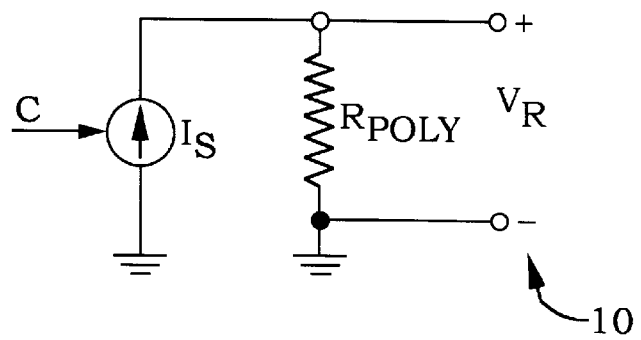
FIG. 1 is a diagrammatic illustration of one preferred embodiment of a circuit for electrically conditioning polysilicon circuit elements, in accordance with the present invention.

Referring now to FIG. 1, one preferred embodiment of a circuit 10 for programming a polysilicon circuit element, in accordance with the present invention, is shown. Circuit 10 includes a polysilicon circuit element that is illustrated in FIG. 1 as a polysilicon resistor $R_{POLY}$, although it is to be understood that the polysilicon circuit element of circuit 10 may alternatively be any known electrical device having a sheet or strip of polysilicon forming at least part of the device, wherein such a sheet or strip of polysilicon is electrically accessible and may therefore be conditioned in accordance with the concepts of the present invention. In any case, circuit 10 further includes a switchable current source $I_S$ connected to $R_{POLY}$ and responsive to a control signal "C" to inject therein a current, $I_S$, such that a voltage, $V_R$, is developed across $R_{POLY}$. Current source $I_S$ may be a steady state current source or may alternatively be a pulsed current source capable of producing a desired current value for a desired duration, and may be implemented as a conventional current source as shown or as a voltage source having sufficient current supplying capacity.

In accordance with the present invention, the circuit 10 of FIG. 1 is used to condition polysilicon resistors or other electrical components including at least one polysilicon resistor forming a part of the component. It has been found that polysilicon undergoes an irreversible change of state, with an attendant 30–50% decrease in resistance, when the steady state current density therethrough exceeds a threshold current density of approximately $3 \times 10^6$ A/cm$^2$. Thus, for example, if $R_{POLY}$ is a 1.2 $\mu$m wide polysilicon strip, the threshold current density will be exceeded if the steady state value of $I_S$ exceeds approximately 10 mA. Exceeding this threshold current density results in a breakdown, and localized melting, of the polysilicon grain boundaries, and causes a significant and irreversible change in the polysilicon resistance that subsequently remains substantially unaffected by harsh or extreme operating conditions such as those encountered in an automotive environment.

Figure 2:
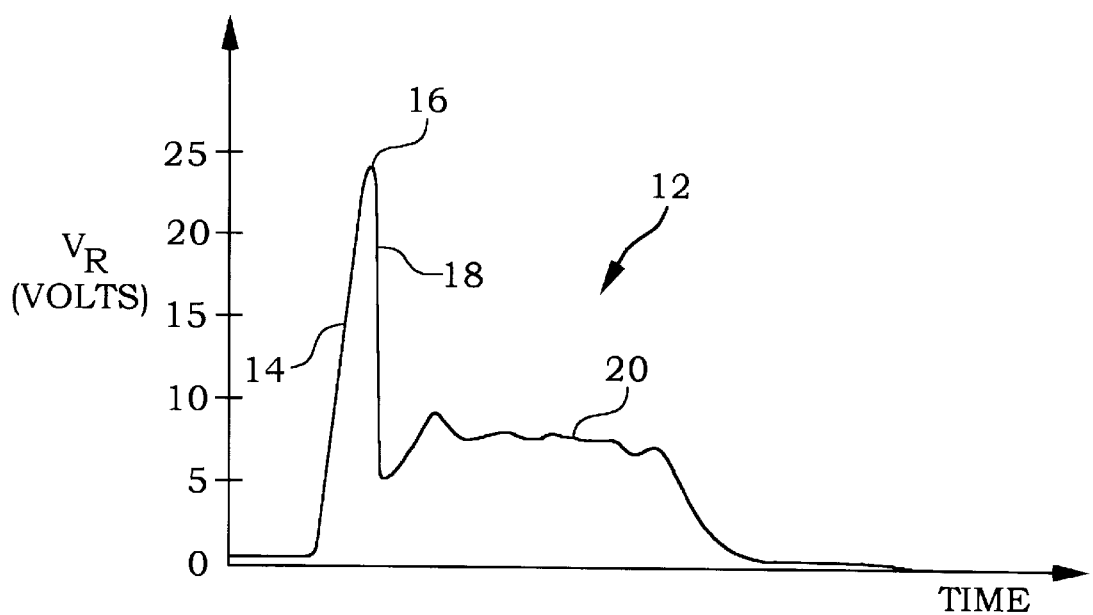
FIG. 2 is a plot of polysilicon circuit element voltage vs. time illustrating the effect thereon of the electrical conditioning technique of the present invention.
Figure 3:
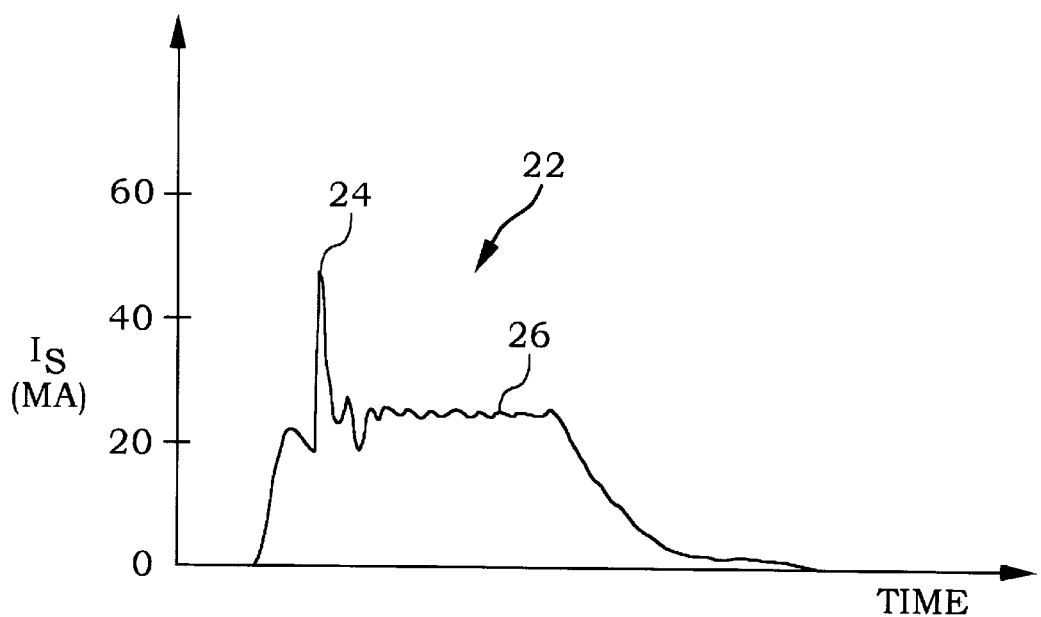
FIG. 3 is a plot of polysilicon circuit element current vs. time illustrating the effect thereof of the electrical conditioning technique of the present invention.

If the current source $I_S$ is a pulsed current source, as described hereinabove, the current level required for the initiation of the change of state is typically greater than that required for the steady state case. Referring to FIGS. 2 and 3, example voltage ($V_R$) and current ($I_S$) plots (vs. time) are shown illustrating the conditioning process just described to thereby irreversibly decrease the resistance value of the polysilicon circuit element $R_{POLY}$ of FIG. 1. In the illustrated example, current source $I_S$ was implemented as a voltage source configured to produce a 25 volt, 3.0 $\mu$s voltage pulse. The resulting $V_R$ voltage waveform 12 experiences an initial rising edge 14 extending to a peak voltage 16 that is followed by a falling edge 18 to a flat and relatively stable voltage 20 for the duration of the pulse. The $I_S$ current waveform 22 likewise rises to a peak current 24, corresponding to the peak voltage 16, and settles thereafter to a relatively stable current 26 for the remainder of the pulse. In the example shown in FIGS. 2 and 3, the resistance of $R_{POLY}$ during the rising edge 16 of $V_R$ was measured to be 433 ohms, and the peak voltage value 16 is approximately 23.6 volts with a corresponding peak current value 24 of approximately 41.2 mA. An irreversible change in the resistance value of $R_{POLY}$ occurred just prior to peaks 16 and 24, and the resistance of $R_{POLY}$ during the post-change stable portions 20 and 26 was measured to be approximately 189 ohms.

Figure 4:
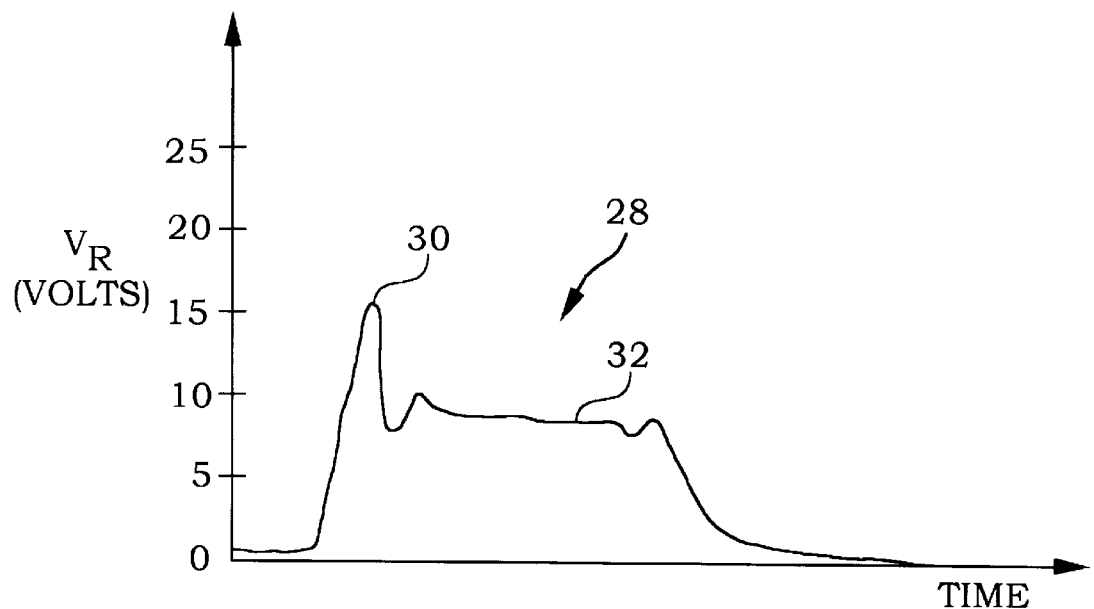
FIG. 4 is a plot of polysilicon circuit element voltage vs. time illustrating the effect thereon of subsequent attempts at performing the electrical conditioning technique illustrated in FIG. 2.
Figure 5:
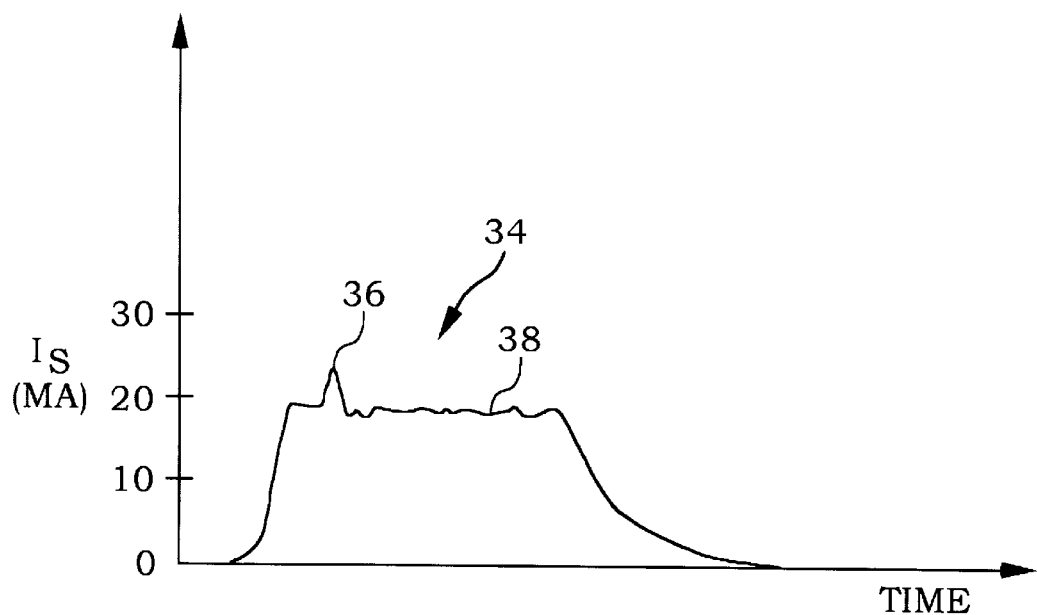
FIG. 5 is a plot of polysilicon circuit element current vs. time illustrating the effect thereof of subsequent attempts at performing the electrical conditioning technique illustrated in FIG. 3.

It has been determined through experimentation that the irreversible change in resistance of $R_{POLY}$, as just described, is generally stable over exposure to temperature extremes. For example, a number of resistors $R_{POLY}$ were subjected to the foregoing programming process and then subject to a 30 hour bake at 265 degrees C. An average resistance increase of only 2% was observed, with resistance increases ranging from 1–8% over the lot. It has also been determined that subsequent programming (at the same current level) of the resistors has little effect on the final resistance value. For example, referring to FIGS. 4 and 5, example voltage ($V_R$) and current ($I_S$) plots (vs. time) are shown illustrating a second attempt at the conditioning process of $R_{POLY}$ just described. In the illustrated example, current source $I_S$ was again implemented as a voltage source configured to produce a 25 volt, 3.0 $\mu$s voltage pulse. The resulting $V_R$ voltage waveform 28 experiences an initial rising edge extending to a peak voltage 30 that is followed by a falling edge to a flat and relatively stable voltage 32 for the duration of the pulse. The $I_S$ current waveform 34 likewise rises to a peak current 36, corresponding to the peak voltage 30, and settles thereafter to a relatively stable current 38 for the remainder of the pulse. In the example shown in FIGS. 4 and 5, the peak voltage value 30 is approximately 15 volts with a corresponding peak current value 24 of approximately 24 mA. The subsequent change in the resistance value of $R_{POLY}$ after the second programming process illustrated in FIGS. 4 and 5 was negligible. In fact, the final resistance value of $R_{POLY}$ after the first programming process was observed to change very little after 50 additional programming pulses under the same programming conditions.

Figure 8:
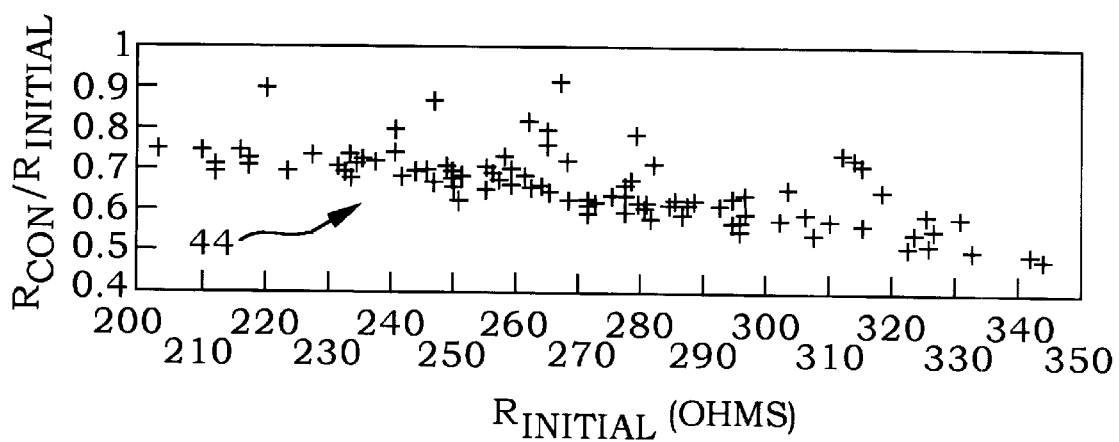
FIG. 8 is a plot of a ratio of the resistances of conditioned resistors and pre-conditioned resistors illustrating the resistance reducing effect thereon of the polysilicon circuit element conditioning technique of the present invention.
Figure 6:
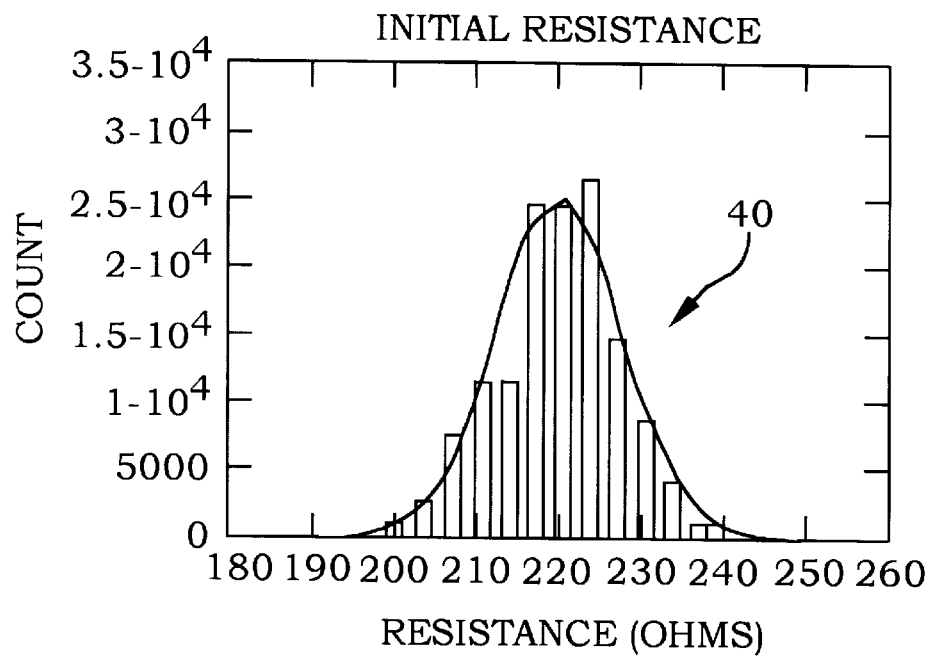
FIG. 6 is a graph of initial resistance values of a number of polysilicon circuit elements illustrating statistical data relating to such elements before conditioning thereof in accordance with the present invention.

The foregoing $R_{POLY}$ programming process was conducted on a sample of different-valued resistors, wherein the mean initial resistance value of the lot was approximately 219 ohms as shown in the histogram 40 of FIG. 6. The programming pulse was again implemented with a voltage source configured to provide a 2.5 $\mu$s pulse, wherein the mean final resistance value of the lot was approximately 161 ohms. It has been observed that the change in resistance of $R_{POLY}$ decreases as the initial resistance decreases and this phenomenon is illustrated in FIG. 8 which shows a ratio, designated generally at 44, of final (conditioned) resistance values to initial resistance values ($R_{CON}/R_{INTIAL}$) vs. initial resistance values ($R_{INITIAL}$). Inspection of FIG. 8 reveals that the fraction ($R_{CON}/R_{INTIAL}$) of resistance decreases as the initial value ($R_{INTIAL}$) increases.

The polysilicon resistor/circuit element conditioning process of the present invention is intended for use in at least two different applications. Those skilled in the art will, however, recognize other applications, and the present invention is intended to encompass such other applications. In any case, a first contemplated application includes providing a number of initial-valued polysilicon resistors and programming selected ones of these resistors in the manner described hereinabove to provide for an array or matrix of memory elements. In one preferred embodiment of this application, the initial values of the resistors are identically-valued, although the present invention contemplates providing the number of polysilicon resistors with a range of values. In any case, the initial values of the polysilicon resistors are preferably chosen such that the final values of the resistors provide for a discernible difference in the current level therethrough as compared with the current level through the initial-valued resistors. In this manner, an array or matrix of such polysilicon resistors may be programmed to define a binary code therein.

Figure 7:
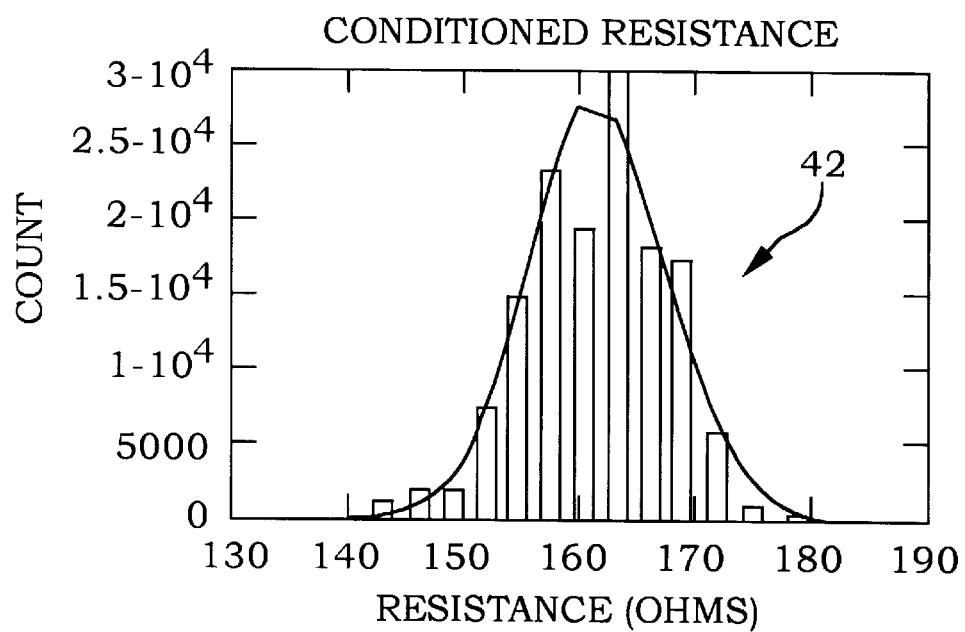
FIG. 7 is a graph of conditioned resistance values of the number of polysilicon circuit elements of FIG. 6 illustrating statistical data relating to such elements after conditioning thereof in accordance with the present invention.

A second contemplated application of the polysilicon resistor conditioning process of the present invention includes electrically conditioning all of a number of polysilicon resistors, as described hereinabove, prior to implementing a conventional programming (i.e., fusing) process on one or more of the pre-conditioned resistors. Subjecting all resistors (fuses) to the electrical conditioning process described hereinabove prior to a conventional fusing process has a number of advantages associated therewith. For example, the conditioned resistance of a number of initially like-valued polysilicon resistors has a tighter resistance distribution that the resistance distribution of the initial-valued resistors. Referring again to FIGS. 6 and 7, the standard deviation of the initial resistance sample 40 of FIG. 6 is 7.555 while the standard deviation of the conditioned resistance sample 42 of FIG. 7 is 5.948. The variability in resistance values is therefore less for conditioned resistors than for initial-valued resistors, and subsequent programming of the resistors (fuses) via conventional techniques may accordingly be more easily controlled. As another advantage, the conditioned resistors may be programmed via conventional fusing techniques with a lower voltage since the resistance values have been reduced by the conditioning process. As yet another advantage, the subsequent fusing process will be less chaotic and more uniform since there will be less noise in the voltage and current waveforms during subsequent fusing of conditioned resistors than with initial-valued resistors. This noise is caused by random contacting with the fused material, and less noise therefore results in less possibility of post-fusing reconduction and correspondingly higher reliability. As still another example, the conditioning of polysilicon resistors as described hereinabove verifies the functioning of the circuitry common to both the conditioning and fusing operations.

Figure 9:
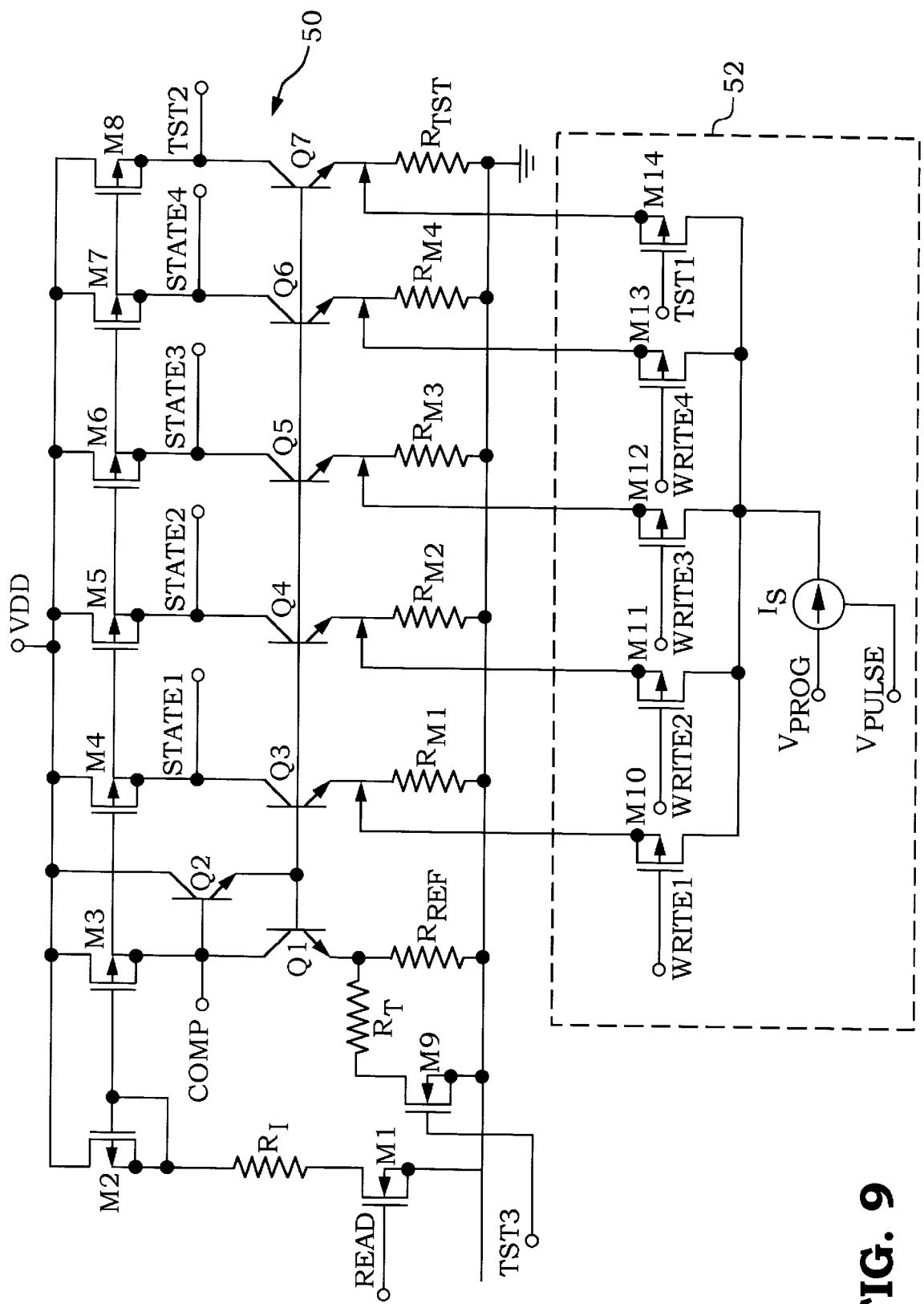
FIG. 9 is a diagrammatic illustration of one preferred embodiment of a polysilicon circuit element conditioning circuit, in accordance with the present invention.

Referring now to FIG. 9, one preferred embodiment of a polysilicon circuit element conditioning circuit 50, in accordance with the present invention, is shown. Circuit 50 includes a first transistor M1 having a gate adapted to receive a READ signal thereat, a drain connected to a first end of a resistor R1 and a source connected to ground potential. The opposite end of R1 is connected to a drain of another transistor M2 having a source connected to a supply voltage VDD and a gate connected to the drain and to the gates of six additional transistors M3–M8 each having sources connected to VDD. The drain of M3 is connected to a base of a NPN transistor Q2 and to a collector of another NPN transistor Q1. The collector of Q1 defines a circuit node COMP. The collector of Q2 is connected to VDD and the emitter of Q1 is connected to first ends of two separate resistors $R_T$ and $R_{REF}$. The opposite end of $R_{REF}$ is connected to ground potential and the opposite end of $R_T$ is connected to a drain of a transistor M9. The source of M9 is connected to ground potential and the gate of M9 defines a circuit input TST3.

The base of Q1 is connected to the emitter of Q2 and to the bases of five additional NPN transistors Q3–Q7. The collectors of Q3–Q7 are connected to corresponding drains of transistors M4–M8 and define circuit outputs STATE1–STATE4 and TST2 respectively. The emitters of Q3–Q7 are each connected to first ends of polysilicon resistors $R_{M1}$–$R_{M4}$ and $R_{TST}$ respectively, wherein the opposite ends of $R_{M1}$–$R_{M4}$ and $R_{TST}$ are connected to ground potential.

Circuit 50 includes a number of programmable polysilicon resistors $R_{M1}$–$R_{M4}$ and $R_{TST}$ respectively, and may represent at least a portion of a memory circuit. Circuit 50 could include additional polysilicon resistors and supporting circuitry to thereby define a larger array or matrix of memory elements. The voltage between STATE1–STATE4 (and TST2) and ground potential define the binary states of the corresponding polysilicon memory elements $R_{M1}$–$R_{M4}$ (and $R_{TST}$). In one embodiment, for example, the polysilicon resistor conditioning of the process may be used to condition only desired ones of $R_{M1}$–$R_{M4}$ (in a manner to be described more fully hereinafter) so that $R_{M1}$–$R_{M4}$ may accordingly be programmed with a desired binary code. In this embodiment, conditioned resistors will have lower resistance values, and the values of the corresponding "STATE" voltages will be lower than the "STATE" voltages of unconditioned resistors. Initial resistance values of $R_{M1}$–$R_{M4}$ are therefore chosen such that the "STATE" voltages of the conditioned resistors are discernable from the "STATE" voltages of the unconditioned resistors. In an alternate embodiment, the polysilicon resistor conditioning of the process may be used to condition each of $R_{M1}$–$R_{M4}$ (in a manner to be described more fully hereinafter) so that $R_{M1}$–$R_{M4}$ may accordingly be selectively programmed with a desired binary code via a conventional programming (i.e., fusing) technique. In this embodiment, the values of the conditioned resistors will have a tighter distribution, and will therefore have all of the advantages associated with pre-conditioned resistor/fuses described hereinabove.

A programming circuit 52 is also included and may be used to condition any one or more of the polysilicon resistors $R_{M1}$–$R_{M4}$ to thereby program a desired binary code therein as described hereinabove, or may alternatively be used to pre-condition all of the polysilicon resistors $R_{M1}$–$R_{M4}$ prior to a conventional programming (i.e., fusing) process. Circuit 52 includes a number of transistors M10–M14 each having a gate adapted to receive corresponding WRITE1–WRITE4 and TST1 signals, and each having a source connected to the emitters of corresponding transistors Q3–Q7. The drains of M10–M14 are connected to one end of a current source $I_S$, wherein $I_S$ may be configured as described hereinabove and may include a first input for receiving a programming voltage $V_{PROG}$ and a second input for receiving a programming pulse $V_{PULSE}$. The programming voltage $V_{PROG}$ and programming pulse $V_{PULSE}$ may be suitably chosen to perform the resistor conditioning process and/or to perform a conventional programming (i.e., fusing) process. For example, if performing the resistor conditioning process of the present invention, $V_{PROG}$ and $V_{PULSE}$ may be suitably chosen to selectively condition one or more of the polysilicon resistors $R_{M1}$–$R_{M4}$ via activation of appropriate ones of the "WRITE" inputs to transistors M10–M13. Current from source $I_S$ will then be directed through corresponding ones of $R_{M1}$–$R_{M4}$ to decrease the resistance thereof as previously described. The values of $V_{PROG}$ and $V_{PULSE}$ in this case may be chosen consistently with the examples given hereinabove. The programmed states of the polysilicon resistors $R_{M1}$–$R_{M4}$ may be measured by activating the "READ" input of circuit 50. When the "READ" input is taken to a logic high state, current sources M3–M8 are energized and the voltage drop across $R_{M1}$–$R_{M4}$ define the logic states of STATE1–STATE4. The logic states of STATE1–STATE4 may be determined by comparing (with an external comparator) the STATE1–STATE4 voltages with the voltage at the COMP circuit node, wherein $R_{REF}$ is preferably formed of an un-conditioned polysilicon resistor having a value equal to the initial value of any of $R_{M1}$–$R_{M4}$. In one embodiment, the difference in the voltages of conditioned vs. un-conditioned resistors is preferably about 30 mV, which is sufficient to ensure reliable circuit operation using a simple comparator of known construction.

On the other hand, circuit 52 may be used to pre-condition all of the resistors $R_{M1}$–$R_{M4}$ as just described, and may thereafter be used to program $R_{M1}$–$R_{M4}$ by selectively fusing open desired ones of $R_{M1}$–$R_{M4}$. In one embodiment wherein each of the polysilicon resistors $R_{M1}$–$R_{M4}$ are formed of 1.2 $\mu$m wide, 18 $\mu$m long, 3500 angstrom thick, 20 ohm/square sheet resistivity polysilicon, the preconditioning process may be performed with one or more current pulses $I_S$ having a 2.5 $\mu$s pulse-width and a 35 mA constant amplitude. As with any polysilicon resistor conditioning process carried out in accordance with the present invention, the foregoing pulse width is preferably chosen so that it is not so long as to allow heat to travel to the resistor contacts and re-alloy the connector metal, nor so short as to require currents having magnitudes close to a fusing current. In the foregoing embodiment, the current source Is is configured for the conventional programming process; i.e., for the fusing process, by setting the current magnitude to approximately 75 mA. The time required to open resistors of the type just described, and which are pre-conditioned according to the present invention, is typically less than 1 $\mu$s. By using fuse pulses this short, the fusing process is effectively independent of the orientation of $R_{M1}$–$R_{M4}$ with respect to gravitational effects thereon. The conventionally longer fusing times carry the possibility of allowing gravity to influence the movement of the melted metal.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected.

What is claimed is:

1. A method of electrically conditioning a polysilicon circuit element, the method comprising the steps of:

providing a polysilicon circuit element; and injecting a first magnitude of current into said polysilicon circuit element, said first magnitude of current causing an irreversible change in resistance of said polysilicon circuit element from a first resistance value to a second lower resistance value, said first magnitude of current corresponding to a steady state current density in said polysilicon circuit element of greater than a predefined current density level.

2. The method of claim 1, wherein said predefined current density level is sufficient to cause localized heating of grain boundaries of said polysilicon circuit element to thereby irreversibly decrease a grain boundary resistance thereof.

3. A method of electrically conditioning a polysilicon circuit element, the method comprising the steps of:

providing a polysilicon circuit element defining first and second alloyed circuit contacts thereto; and injecting a first magnitude of current into said polysilicon circuit element for a current pulse duration, said first magnitude of current causing an irreversible change in resistance of said polysilicon circuit element from a first resistance value to a second lower resistance value;

wherein said current pulse duration is less than that at which heating of said polysilicon circuit element would result in re-alloying of either of said first and second alloyed circuit contacts.

4. A method of electrically conditioning a polysilicon circuit element, the method comprising the steps of:

providing a polysilicon circuit element; and injecting a first magnitude of current into said polysilicon circuit element for a current pulse duration, said first magnitude of current causing an irreversible change in resistance of said polysilicon circuit element from a first resistance value to a second lower resistance value;

wherein said current pulse duration is greater than that which would require said first magnitude of current to be near a current level capable of fusing open said polysilicon circuit element.

5. A method of electrically conditioning a polysilicon circuit element, the method comprising the steps of:

providing a polysilicon circuit element;

injecting a first magnitude of current into said polysilicon circuit element, said first magnitude of current causing an irreversible change in resistance of said polysilicon circuit element from a first resistance value to a second lower resistance value; and injecting a second magnitude of current into said polysilicon circuit element greater than said first magnitude of current, said second magnitude of current fusing open said polysilicon element.

6. A method of electrically conditioning a polysilicon circuit element, the method comprising the steps of:

providing a polysilicon circuit element;

injecting a first magnitude of current into said polysilicon circuit element, said first magnitude of current causing an irreversible change in resistance of said polysilicon circuit element from a first resistance value to a second lower resistance value;

repeating the providing step a number of times to thereby provide a number of polysilicon circuit elements, said number of polysilicon circuit elements each having resistance values substantially equal to said first resistance value; and performing the injecting step on certain ones of said number of polysilicon circuit elements, said number of polysilicon circuit elements thereby defining a memory circuit having a binary code programmed therein.

7. Apparatus for electrically conditioning a polysilicon circuit element, comprising:

a polysilicon circuit element defining a first resistance value; and a current source responsive to a first control signal to supply a first magnitude of current to said polysilicon circuit element, said first magnitude of current causing an irreversible change in resistance of said polysilicon circuit element from said first resistance value to a second lower resistance value by causing localized heating of grain boundaries of said polysilicon circuit element to thereby irreversibly decrease a grain boundary resistance thereof.

8. The apparatus of claim 7 wherein said current source is further responsive to said first control signal to supply said first magnitude of current to said polysilicon circuit element for a current pulse duration.

9. The apparatus of claim 7 wherein said current source is responsive to a second control signal to supply a second magnitude of current to said polysilicon circuit element, said second magnitude of current fusing open said polysilicon circuit element.

10. The apparatus of claim 7 further including a number of said polysilicon circuit elements each defining a resistance value substantially equal to said first resistance value; and wherein said current source is responsive to said first control signal to supply said first magnitude of current to certain ones of said number of polysilicon circuit elements, said number of polysilicon circuit elements thereby defining a memory circuit having a binary code programmed therein.

11. The apparatus of claim 7 wherein said polysilicon circuit element is formed of a sheet of polysilicon.

* * * * *